(12) United States Patent
Yamaguchi

(10) Patent No.: US 7,982,638 B2
(45) Date of Patent: Jul. 19, 2011

(54) DATA TRANSMISSION CIRCUIT AND DATA COMMUNICATION SYSTEM

(75) Inventor: Hisakatsu Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 12/546,166

(22) Filed: Aug. 24, 2009

(65) Prior Publication Data

US 2009/0309771 A1    Dec. 17, 2009

Related U.S. Application Data

(63) Continuation of application No. PCT/JP2007/053534, filed on Feb. 26, 2007.

(51) Int. Cl.
*H03M 9/00* (2006.01)
(52) U.S. Cl. ............... 341/101; 370/509; 347/61
(58) Field of Classification Search .......... 341/100–101; 370/509; 347/61, 9, 10; 375/364, 365, 368; 400/120.01, 124.01
See application file for complete search history.

(56) References Cited

U.S. PATENT DOCUMENTS

| | | | |
|---|---|---|---|
| 5,012,240 A * | 4/1991 | Takahashi et al. ............ | 341/101 |
| 5,714,904 A | 2/1998 | Jeong | |
| 6,188,339 B1 | 2/2001 | Hasegawa | |
| 6,741,193 B2 * | 5/2004 | Nagata ............ | 341/101 |
| 6,755,580 B2 * | 6/2004 | Furukawa et al. ....... | 400/120.01 |
| 6,816,095 B1 | 11/2004 | Yokoyama et al. | |
| 7,292,668 B2 * | 11/2007 | Yamawaki ............ | 375/364 |
| 7,364,272 B2 * | 4/2008 | Furukawa et al. ............ | 347/61 |
| 2002/0075173 A1 | 6/2002 | Nagata | |
| 2005/0147178 A1 | 7/2005 | Kikuchi | |

FOREIGN PATENT DOCUMENTS

| | | |
|---|---|---|
| JP | 64-029122 | 1/1989 |
| JP | 08-56240 A | 2/1996 |
| JP | 08-328819 | 12/1996 |
| JP | 11-215010 A | 8/1999 |
| JP | 2001-203585 A | 7/2001 |
| JP | 2002-152053 A | 5/2002 |
| JP | 2005-142872 | 6/2005 |
| WO | WO 03/028221 A1 | 4/2003 |

OTHER PUBLICATIONS

Nestoras Tzartzanis, et al. "A Reversible Poly-Phase Distributed VCO," 2006 IEEE International Solid-State Circuits Conference, Digest of Technical Papers, pp. 596-597, and 676.

* cited by examiner

*Primary Examiner* — Lam T Mai
(74) *Attorney, Agent, or Firm* — Arent Fox LLP

(57) ABSTRACT

A data transmission circuit that converts parallel data signals into a serial data signal to transmit the serial data signal includes a clock generation circuit, an output circuit, and a shift register circuit for securely conducting data communication among internal elements regardless of the improvement in data transfer rate, the increase in manufacturing variance, the variation in power supply voltage and temperature, and the like. The clock generation circuit generates a clock signal. The output circuit is provided to output the serial data signal. The shift register circuit acquires the parallel data signals and sequentially transfers the acquired parallel data signals to the output circuit in a bitwise manner with the use of a shift operation synchronized with the clock signal from the clock generation circuit.

8 Claims, 8 Drawing Sheets

US 7,982,638 B2

DATA TRANSMISSION CIRCUIT AND DATA COMMUNICATION SYSTEM

CROSS-REFERENCE TO RELATED APPLICATION

This application is a Continuation Application of International Application No. PCT/JP2007/053534, filed Feb. 26, 2007, designating the U.S., the entire contents of which are incorporated herein by reference.

FIELD

The embodiment is related to a data transmission circuit and a data communication system applied for performing data communication among elements or circuit blocks.

BACKGROUND

FIG. 5 illustrates an example of a data transmission circuit in a related art. A data transmission circuit 100 includes a PLL (Phase Locked Loop) circuit 101, dividers 102 to 104, a FIFO (First-In First-Out) 105, multiplexers (MUXs) 106 to 109, and an output driver 110. The PLL circuit 101 generates a clock signal CKA (frequency: 20 GHz) based on a clock signal REF_CK (frequency: 625 MHz). The divider 102 frequency-divides the clock signal CKA into ½ to generate a clock signal CKB (frequency: 10 GHz). The divider 103 frequency-divides the clock signal CKB into ½ to generate a clock signal CKC (frequency: 5 GHz). The divider 104 frequency-divides the clock signal CKC into ½ to generate a clock signal CKD (frequency: 2.5 GHz).

The FIFO 105 sequentially acquires parallel data signals USR_DT (16 bits) in synchronization with a clock signal USR_CK (frequency: 2.5 GHz), and outputs them as data signals DTE (16 bits) in response to a rising transition of the clock signal CKD in order from the earliest acquired data signals. The multiplexer 106 converts the data signal DTE into data signals DTD (8 bits) synchronized with the clock signal CKD. The multiplexer 107 converts the data signals DTD into data signals DTC (4 bits) synchronized with the clock signal CKC. The multiplexer 108 converts the data signals DTC into data signals DTB (2 bits) synchronized with the clock signal CKB. The multiplexer 109 converts the data signals DTB into a data signal DTA (1 bit) synchronized with the clock signal CKA. The output driver 110 receives the data signal DTA and outputs it as a serial data signal TX_DT.

FIG. 6 illustrates a part of the data transmission circuit of FIG. 5. The divider 102 includes a flip-flop FD and an inverter INV. In synchronization with a rising transition of the clock signal CkA supplied from the PLL circuit 101 (FIG. 5), the flip-flop FD acquires an output signal of the inverter INV and outputs it. The inverter INV inverts the output signal of the flip-flop FD and outputs it. By such a configuration, the clock signal CKB formed by frequency-dividing the clock signal CKA into ½ is generated.

The multiplexer 108 includes latch circuits LM0 to LM9 and selectors SEL0 and SELL for converting 4-bit data signals DTC0 to DTC3 supplied from the multiplexer 107 (FIG. 5) into 2-bit data signals DTB0 and DTB1 synchronized with the clock signal CKB. In synchronization with a rising transition of the clock signal CKB, the latch circuit LM0 acquires the data signal DTC0 and outputs it. In synchronization with a falling transition of the clock signal CKB, the latch circuit LM1 acquires an output signal of the latch circuit LM0 and outputs it. In synchronization with a rising transition of the clock signal CKB, the latch circuit LM2 acquires the data signal DTC2 and outputs it. In synchronization with a falling transition of the clock signal CKB, the latch circuit LM3 acquires an output signal of the latch circuit LM2 and outputs it. In synchronization with a rising transition of the clock signal CKB, the latch circuit LM4 acquires an output signal of the latch circuit LM3 and outputs it. The selector SEL0 selects an output signal of the latch circuit LM1 to output it as the data signal DTB0 during a high level period of the clock signal CKB, and selects an output signal of the latch circuit LM4 to output it as the data signal DTB0 during a low level period of the clock signal CKB.

In synchronization with a rising transition of the clock signal CKB, the latch circuit LM5 acquires the data signal DTC1 and outputs it. In synchronization with a falling transition of the clock signal CKB, the latch circuit LM6 acquires an output signal of the latch circuit LM5 and outputs it. In synchronization with a rising transition of the clock signal CKB, the latch circuit LM7 acquires the data signal DTC3 and outputs it. In synchronization with a falling transition of the clock signal CKB, the latch circuit LM8 acquires an output signal of the latch circuit LM7 and outputs it. In synchronization with a rising transition of the clock signal CKB, the latch circuit LM9 acquires an output signal of the latch circuit LM8 and outputs it. The selector SEL1 selects an output signal of the latch circuit LM6 to output it as the data signal DTB1 during a high level period of the clock signal CKB, and selects an output signal of the latch circuit LM9 to output it as the data signal DTB1 during a low level period of the clock signal CKB. By the configuration as described above, the 4-bit data signals DTC0 to DTC3 are converted into the 2-bit data signals DTB0 and DTB1 synchronized with the clock signal CKB.

The multiplexer 109 includes latch circuits LM10 to LM14 and a selector SEL2 for converting the 2-bit data signals DTB0 and DTB1 into 1-bit data signal DTA synchronized with the clock signal CKA. In synchronization with a rising transition of the clock signal CKA, the latch circuit LM10 acquires the data signal DTB0 and outputs it. In synchronization with a falling transition of the clock signal CKA, the latch circuit LM11 acquires an output signal of the latch circuit LM10 and outputs it. In synchronization with a rising transition of the clock signal CKA, the latch circuit LM12 acquires the data signal DTB1 and outputs it. In synchronization with a falling transition of the clock signal CKA, the latch circuit LM13 acquires an output signal of the latch circuit LM12 and outputs it. In synchronization with a rising transition of the clock signal CKA, the latch circuit LM14 acquires an output signal of the latch circuit LM13 and outputs it. The selector SEL2 selects an output signal of the latch circuit LM11 to output it as the data signal DTA during a high level period of the clock signal CKA, and selects an output signal of the latch circuit LM14 to output it as the data signal DTA during a low level period of the clock signal CKA. By the configuration as described above, the 2-bit data signals DTB0 and DTB1 are converted into the 1-bit data signal DTA synchronized with the clock signal CKA.

FIG. 7 and FIG. 8 illustrate a state of data communication between the multiplexers in FIG. 6. A transmission timing of the data signals DTB0 and DTB1 in the multiplexer 108 is defined by the rising transition or the failing transition of the clock signal CKB, and a reception timing of the data signals DTB0 and DTB1 in the multiplexer 109 is defined by the rising transition of the clock signal CKA. Therefore, in order to securely conduct the data communication between the multiplexers 108 and 109, a sum of a delay time t1 from an occurrence of the rising transition of the clock signal CKA to an occurrence of the rising transition or the failing transition of the clock signal CKB in the divider 102 and a delay time t2 from an occurrence of the rising transition or the falling transition of the clock signal CKB until a determination of the data signals DTB0 and DTB1 in the multiplexer 108, has to be shorter than a cycle T of the clock signal CKA.

As illustrated in FIG. 7, when the delay times t1 and t2 are short and there is a sufficient timing margin in a phase relationship among the clock signal CKA and the data signals DTB0 and DTB1, the data communication is correctly conducted between the multiplexers 108 and 109. Meanwhile, as illustrated in FIG. 8, when the delay times t1 and t2 are long and there is no sufficient timing margin in the phase relationship among the clock signal CKA and the data signals DTB0 and DTB1, there is a possibility that the data signals DTB0 and DTB1 are not determined at the time of the occurrence of the rising transition of the clock signal CKA, and in that case, the multiplexer 109 (latch circuits LM10 and LM12) cannot correctly receive the data signals DTB0 and DTB1.

Further, a technology relevant to a parallel-to-serial conversion circuit which converts parallel data signals into a serial data signal is disclosed in, for example, Patent Documents 1 and 2.

Patent Document 1: Japanese Laid-open Patent Publication No. 08-056240

Patent Document 2: International Publication Pamphlet No. WO 03/028221

Recently, an information amount to be processed tends to be increased in computer (information processing) and information communication fields, and in order to deal with the increase in the information amount, a data transfer rate (data communication speed) among LSIs configuring a system has been increased. Even though only on a research level, a CMOS (Complementary Metal Oxide Semiconductor)—10 Gbps transceiver was announced in 2002. Subsequently, an attention has been paid to a research regarding a CMOS-40 Gbps transceiver. In a region in which a high data transfer rate is required, a leading-edge technology is applied and, for example, regarding the CMOS-40 Gbps transceiver, a research has been carried out by assuming a technology of 0.1 μm or less.

In a data communication system to which a high data transfer rate is required, there is a need to increase a frequency of a clock signal inside a LSI. Further, in accordance with a microfabrication of a semiconductor process, a performance of a transistor is improved, but, a manufacturing variance becomes quite large. Conventionally, circuit blocks that conduct the data communication were designed to be brought close to one another as much as possible in a layout design of the LSI, to thereby secure a timing margin at the time of receiving data. However, owing to the improvement in data transfer rate, the increase in manufacturing variance, and the like, such a method almost reaches its limits. Specifically, it has been getting difficult to securely conduct the data communication between the multiplexers as illustrated in FIG. 8 with the use of the data transmission circuit illustrated in FIG. 5.

Further, a parallel-to-serial conversion circuit of Patent Document 1 includes a plurality of registers that acquire parallel data signals, a plurality of AND gates that receive an output signal of a corresponding register among the plurality of registers and a corresponding clock signal among a plurality of clock signals having mutually different phases, and OR gates that generate a serial data signal from output signals of the plurality of AND gates. In the parallel-to-serial conversion circuit of Patent Document 1, the AND gate relating to the serial data signal is sequentially switched, so that a variation in drivability of the AND gates and a mutual influence among the AND gates occurred at the time of switching the AND gates are likely to appear on an eye pattern of the serial data signal. Accordingly, the circuit is not suitably used when a high data transfer rate is required.

A parallel-to-serial conversion circuit of Patent Document 2 includes a plurality of switch circuits that output corresponding bits of parallel data signals for a period of time corresponding to a phase difference of a corresponding pair of clock signals among a plurality of clock signals having mutually different phases, and an adder that adds output signals of the plurality of switch circuits to generate a serial data signal. In the parallel-to-serial conversion circuit of Patent Document 2, the switch circuit relating to the serial data signal is sequentially switched, so that, for the same reason as that of the parallel-to-serial conversion circuit of Patent Document 1, the conversion circuit is not suitably used when a high data transfer rate is required.

A proposition of the embodiment is to provide a technology with which data communication among internal elements in a data transmission circuit is securely conducted regardless of the improvement in data transfer rate, the increase in manufacturing variance, the variation in power supply voltage and temperature, and the like.

SUMMARY

According to an aspect of the embodiment, a data transmission circuit of a data communication system is a data transmission circuit that converts parallel data signals into a serial data signal to transmit the serial data signal, and includes a clock generation circuit, an output circuit, and a shift register circuit. The clock generation circuit generates a clock signal. For instance, the clock generation circuit is embodied by a voltage controlled oscillator configured by annularly distributing inductance components and capacitance components. The output circuit is provided to output the serial data signal. The shift register circuit acquires the parallel data signals and sequentially transfers the acquired parallel data signals to the output circuit in a bitwise manner with the use of a shift operation synchronized with the clock signal from the clock generation circuit.

The object and advantages will be realized and attained by means of the elements and combinations particularly pointed out in the claims.

It is to be understood that both the foregoing general description and the following detailed description are exemplary and explanatory and are not restrictive, as claimed.

DESCRIPTION OF THE EMBODIMENTS

Figure 1:
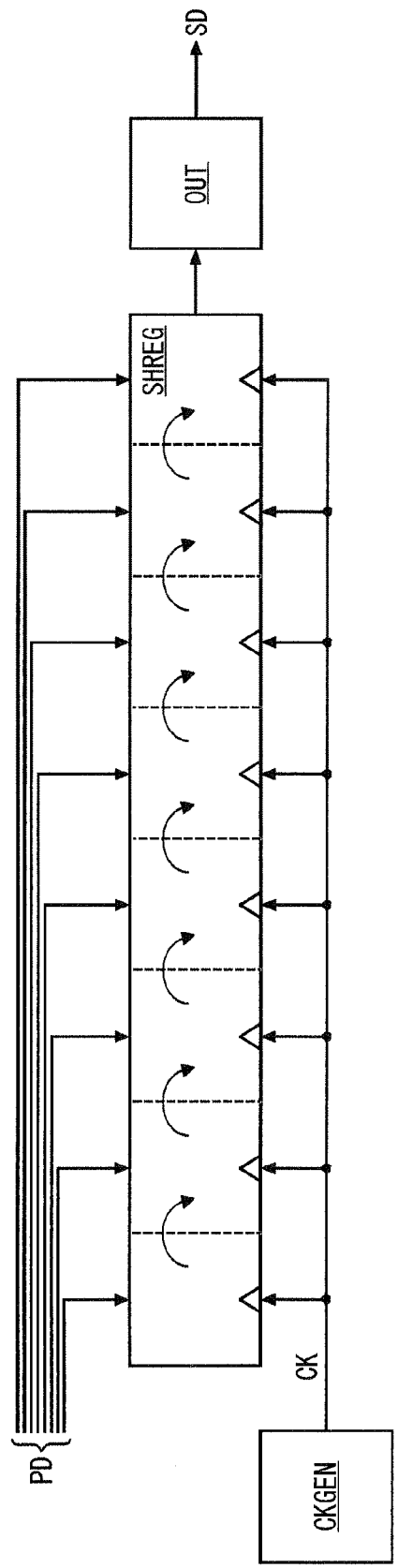
FIG. 1 is an explanatory diagram illustrating a basic concept.

Before explaining an embodiment, a basic concept will be described with reference to the drawings. FIG. 1 illustrates the basic concept. In the embodiment, a data transmission circuit that converts parallel data signals PD into a serial data signal SD to transmit the serial data signal includes a clock generation circuit CKGEN, an output circuit OUT, and a shift register circuit SHREG. The clock generation circuit CKGEN generates a clock signal CK. The output circuit OUT is provided to output the serial data signal SD. The shift register circuit SHREG acquires the parallel data signals PD and sequentially transfers, with the use of a shift operation synchronized with the clock signal CK, the acquired parallel data signals PD to the output circuit OUT in a bitwise manner.

In order to securely perform data communication among registers (flip-flops) configuring the shift register circuit SHREC, it is only required that a time from an occurrence of a rising transition (falling transition) of the clock signal CK until a determination of an output signal of the register is shorter than a cycle of the clock signal CK. Accordingly, it is possible to conduct the data communication among internal elements in the data transmission circuit with a sufficiently large timing margin. The embodiment has been made based on such a basic concept.

Figure 2:
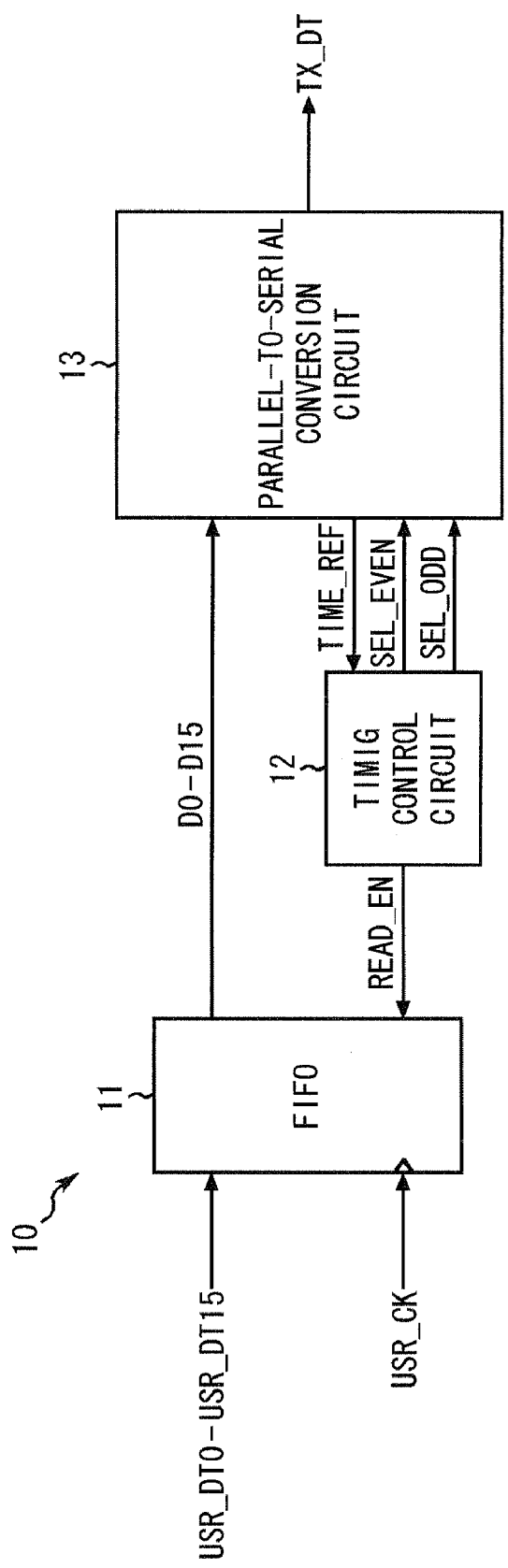
FIG. 2 is an explanatory diagram illustrating one embodiment.

Hereinafter, an embodiment will be described with reference to the drawings. FIG. 2 illustrates one embodiment. A data transmission circuit 10 includes a FIFO 11, a timing control circuit 12, and a parallel-to-serial conversion circuit 13. In a data communication system having a data transmission unit that converts parallel data signals synchronized with a low-speed clock signal into a serial data signal synchronized with a high-speed clock signal to transmit the serial data signal, and a data reception unit that receives the serial data signal synchronized with the high-speed clock signal and converts it into the parallel data signals synchronized with the low-speed clock signal, the data transmission circuit 10 embodies the data transmission unit.

The FIFO 11 sequentially acquires parallel data signals USR_DT0 to USR_DT15 in synchronization with a clock signal USR_CK, and outputs them as data signals D0 to D15 In response to a rising transition of a read enable signal READ_EN in order from the earliest acquired data signals. The timing control circuit 12 temporality sets, in response to a rising transition of a timing signal TIME_REF, the read enable signal READ_EN and selection signals SEL_EVEN and SEL_ODD at a high level at a desired timing. The parallel-to-serial conversion circuit 13 uses the selection signals SEL_EVEN and SEL_ODD to convert the parallel data signals D0 to D15 into a serial data signal TX_DT. In addition, the parallel-to-serial conversion circuit 13 temporality sets the timing signal TIME_REF at a high level at a desired timing.

Figure 3:
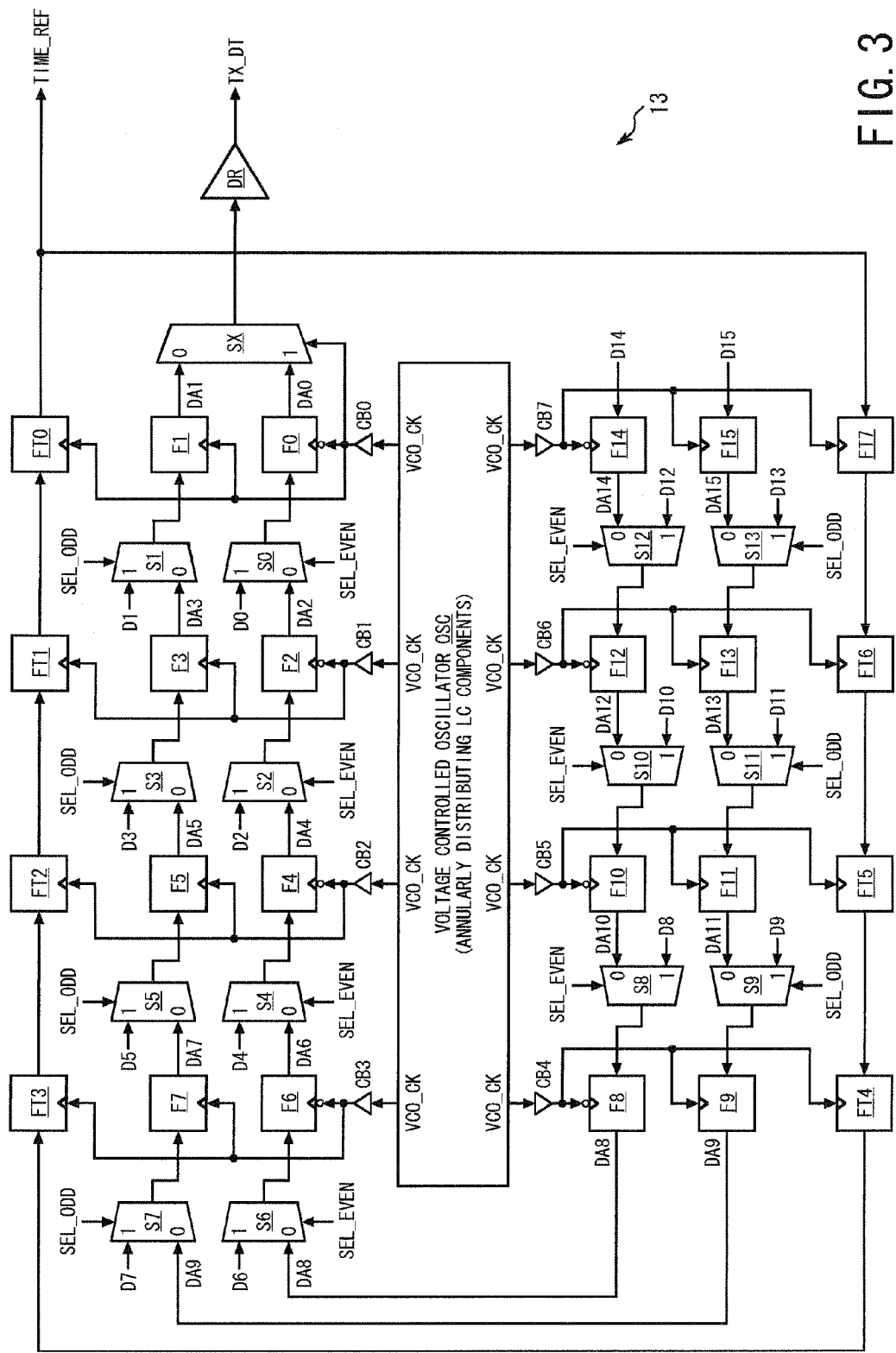
FIG. 3 is an explanatory diagram illustrating an internal configuration of a parallel-to-serial conversion circuit of FIG. 2.

FIG. 3 illustrates an internal configuration of the parallel-to-serial conversion circuit of FIG. 2. The parallel-to-serial conversion circuit 13 includes a voltage controlled oscillator (VCO) OSC, clock buffers CB0 to CB7, flip-flops F0 to F15, selectors S0 to S13, a selector SX, an output driver DR, and flip-flops FT0 to FT7.

The voltage controlled oscillator OSC is a voltage controlled oscillator configured by annularly distributing inductance components and capacitance components. The voltage controlled oscillator with such a configuration is disclosed in, for example, a reference (Nestoras Tzartzanis and William W. Walker, "A Reversible Poly-Phase Distributed VCO," IEEE ISSCC Dig. Tech. Papers, pp. 596-597, 2006.), so that detailed explanation will be omitted here. An oscillation frequency fosc of the voltage controlled oscillator OSC (frequency of a clock signal VCO_CK generated by the voltage controlled oscillator OSC) is represented by $1/(2\pi \times \sqrt{L} \times \sqrt{C})$ by using an inductance component L and a capacitance component C configuring the voltage controlled oscillator OSC. Accordingly, in order to lower the oscillation frequency fosc of the voltage controlled oscillator OSC, there is a need to significantly enlarge the inductance component L and the capacitance component C. However, the data transmission circuit 10 is configured by assuming a high data transfer rate of about 40 Gbps, so that it is possible to apply the voltage controlled oscillator OSC.

In synchronization with a falling transition of the clock signal VCO_CK of the voltage controlled oscillator OSC supplied via the clock buffer CB7, the flip-flop F14 acquires the data signal D14 and outputs it as a data signal DA14. The selector S12 (S10, S8, S6, S4, S2, S0) selects the data signal D12 (D10, D8, D6, D4, D2, D0) to output it during a high level period of the selection signal SEL_EVEN, and selects the data signal DA14 (DA12, DA10, DA8, DA6, DA4, DA2) to output it during a low level period of the selection signal SEL_EVEN. In synchronization with a falling transition of the clock signal VCO_CK of the voltage controlled oscillator OSC supplied via the clock buffer CB6 (CB5, CB4, CB3, CB2, CB1, CB0), the flip-flop F12 (F10, F8, F6, F4, F2, F0) acquires an output signal of the selector S12 (S10, S8, S6, S4, S2, S0) and outputs it as the data signal DA12 (DA10, DA8, DA6, DA4, DA2, DA0).

In synchronization with a rising transition of the clock signal VCO_CK of the voltage controlled oscillator OSC supplied via the clock buffer CB7, the flip-flop F15 acquires the data signal D15 and outputs it as a data signal DA15. The selector S13 (S11, S9, S7, S5, S3, S1) selects the data signal D13 (D11, D9, D7, D5, D3, D1) to output it during a high level period of the selection signal SEL_ODD, and selects the data signal DA15 (DA13, DA11, DA9, DA7, DA5, DA3) to output it during a low level period of the selection signal SEL_ODD. In synchronization with a rising transition of the clock signal VCO_CK of the voltage controlled oscillator OSC supplied via the clock buffer CB6 (CB5, CB4, CB3, CB2, CB1, CB0), the flip-flop F13 (F11, F9, F7, F5, F3, F1) acquires an output signal of the selector S13 (S11, S9, S7, S5, S3, S1) and outputs it as the data signal DA13 (DA11, DA9, DA7, DA5, DA3, DA1). The selector SX selects the data signal DA0 to output it during a high level period of the clock signal VCO_CK of the voltage controlled oscillator OSC supplied via the clock buffer CB0, and selects the data signal DA1 to output it during a low level period of the clock signal VCO_CK of the voltage controlled oscillator OSC supplied via the clock buffer CB0. The output driver DR receives an output signal of the selector SX and outputs it as serial data signal TX_DT.

In synchronization with a rising transition of the clock signal VCO_CK of the voltage controlled oscillator OSC supplied via the clock buffer CB0 (CB1 to CB7), the flip-flop FT0 (FT1 to FT7) acquires an output signal of the flip-flop FT1 (FT2 to FT7, FT0) and outputs it. Incidentally, an output signal of the flip-flop FT0 is also supplied to the timing control circuit 12 (FIG. 2) as the timing signal TIME_REF. One of the flip-flops FT0 to FT7 is initialized to a set state in response to the operation start request to the data transmission circuit 10, and the rest of the flip-flops FT0 to FT7 are initialized to a reset state in response to the operation start request to the data transmission circuit 10. Namely, an output signal of one of the flip-flops FT0 to FT7 is initialized to a high level in response to the operation start request to the data transmission circuit 10, and output signals of the rest of the flip-flops FT0 to FT7 are initialized to a low level in response to the operation start request to the data transmission circuit 10. Accordingly, the timing signal TIME_REF is set at a high level as long as one cycle of a clock signal CKA for every eight cycles of the clock signal CKA.

Note that a clock transmission path in the voltage controlled oscillator OSC, a data transmission path through the flip-flops F14, F12, F10, F8, F6, F4, F2, and F0, a data transmission path through the flip-flops F15, F13, F11, F9, F7, F5, F3, and F1, and a data transmission path through the flip-flops FT7 to FT0 are laid out for signal transmissions to run in parallel (signals are transmitted in the same direction) among these transmission paths.

Figure 4:
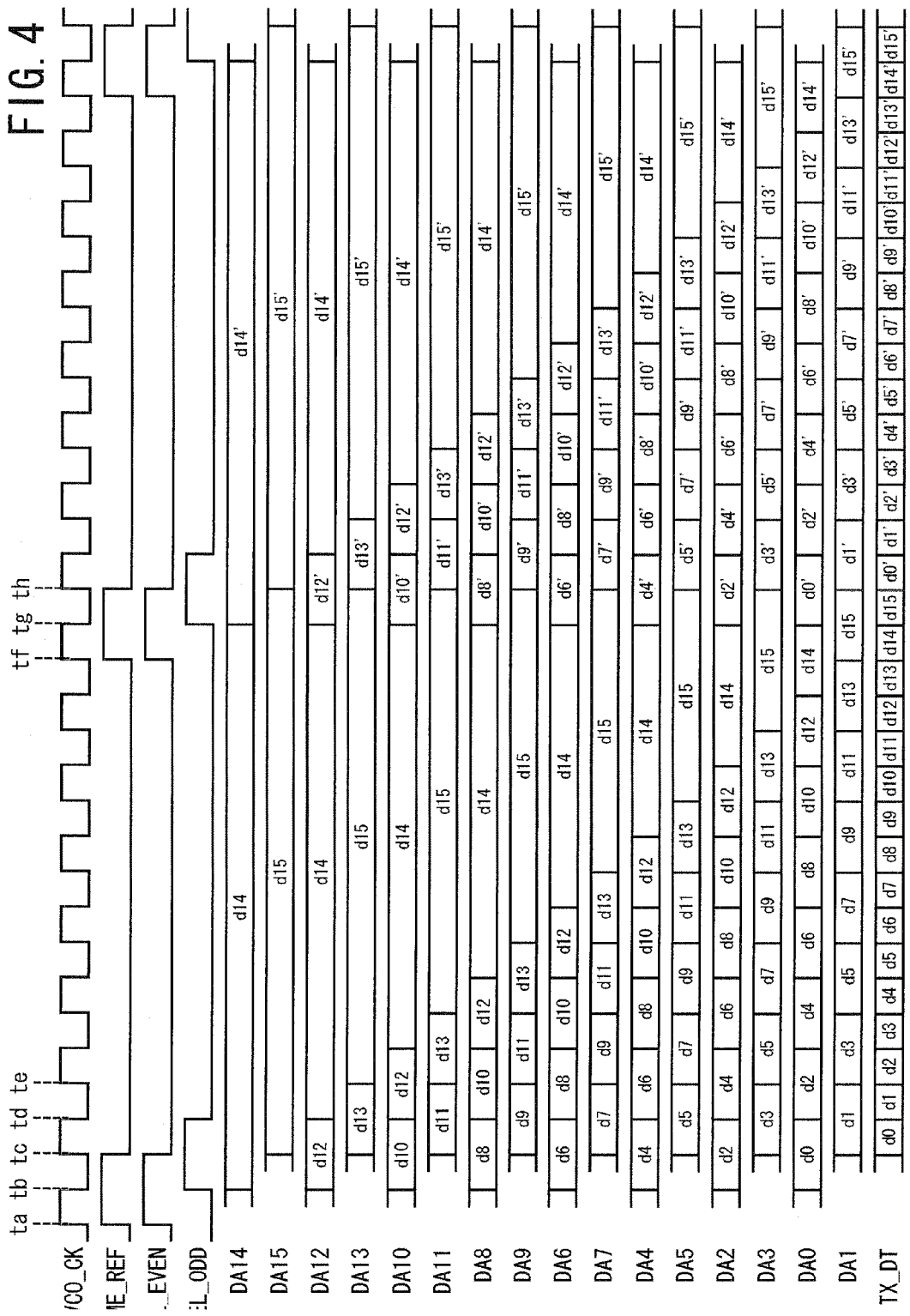
FIG. 4 is an explanatory diagram illustrating an internal operation of the parallel-to-serial conversion circuit of FIG. 2.

FIG. 4 illustrates an internal operation of the parallel-to-serial conversion circuit of FIG. 2. When a rising transition of the timing signal TIME_REF is occurred at time ta, a rising transition of the selection signal SEL_EVEN supplied from the timing control circuit 12 is occurred. Further, although the illustration is omitted, when the rising transition of the timing signal TIME_REF is occurred, a rising transition of the read enable signal READ_EN from the timing control circuit 12 to the FIFO 11 is occurred, and the data signals D0 to D15 supplied from the FIFO 11 are set to desired logic values d0 to d15.

When a falling transition of the clock signal VCO_CK is occurred, at time tb, in a state where the selection signal SEL_EVEN is set at a high level, since the selector S12 (S10, S8, S6, S4, S2, S0) selects the data signal D12 (D10, D8, D6, D4, D2, D0), the data signal DA14 (DA12, DA10, DA8, DA6, DA4, DA2, DA0) supplied from the flip-flop FR4 (F12, F10, F8, F6, F4, F2, F0) is set to the logic value d14 (d12, d10, d8, d6, d4, d2, d0). Further, at the time tb, a rising transition of the selection signal SEL_ODD supplied from the timing control circuit 12 is occurred.

When a rising transition of the clock signal VCO_CK is occurred, at time tc, in a state where the selection signal SEL_ODD is set at a high level, since the selector S13 (S11, S9, S7, S5, S3, S1) selects the data signal D13 (D11, D9, D7, D5, D3, D1), the data signal DA15 (DA13, DA11, DA9, DA7, DA5, DA3, DA1) supplied from the flip-flop F15 (F13, F11, F9, F7, F5, F3, F1) is set to the logic value d15 (d13, d11, d9, d7, d5, d3, d1). In addition, when the rising transition of the clock signal VCO_CK is occurred, the selector SX selects the data signal DA0, so that the serial data signal TX_DT is set to the logic value do. Further, at the time tc, a falling transition of the selection signal SEL_EVEN is occurred.

When a falling transition of the clock signal VCO_CK is occurred, at time td, in a state where the selection signal SELEVEN is set at a low level, since the selector S12 (S10, S8, S6, S4, S2, S0) selects the data signal DA14 (DA12, DA10, DA8, DA6, DA4, DA2), the data signal DA12 (DA10, DA8, DA6, DA4, DA2, DA0) supplied from the flip-flop F12 (F10, F8, F6, F4, F2, F0) is set to the logic value d14 (d12, d10, d8, d6, d4, d2). In addition, when the falling transition of the clock signal VCO_CK is occurred, the selector SX selects the data signal DA1, so that the serial data signal TX_DT is set to the logic value d1. Further, at the time td, a falling transition of the selection signal SEL_ODD is occurred.

When a rising transition of the clock signal VCO_CK is occurred, at time te, in a state where the selection signal SEL_ODD is set at a low level, since the selector S13 (S11, S9, S7, S5, S3, S1) selects the data signal DA15 (DA13, DA11, DA9, DA7, DA5, DA3), the data signal DA13 (DA11, DA9, DA7, DA5, DA3, DA1) supplied from the flip-flop F13 (F11, F9, F7, F5, F3, F1) is set to the logic value d15 (d13, d11, d9, d7, d5, d3). In addition, when the rising transition of the clock signal VCO_CK is occurred, the selector SX selects the data signal DA0, so that the serial data signal TX_DT is set to the logic value d2. Thereafter, the same operation as that at the time td is performed every time a falling transition of the clock signal VCO_CK is occurred, and the same operation as that at the time te is performed every time a rising transition of the clock signal VCO_CK is occurred, to thereby sequentially set the serial data signal TX_DT to the logic values d3 to d15.

Further, at time tf (time at which a period of time corresponding to eight cycles of the clock signal VCO_CK elapses from the time ta), a rising transition of the timing signal TIME_REF is occurred again. In accordance with this, a rising transition of the selection signal SEL_EVEN is occurred. Further, when the rising transition of the timing signal TIME_REF is occurred, a rising transition of the read enable signal READ_EN from the timing control circuit 12 to the FIFO 11 is occurred, and the data signals D0 to D15 supplied from the FIFO 11 are set to desired logic values d0' to d15'.

When a falling transition of the clock signal VCO_CK is occurred, at time tg, in a state where the selection signal SEL_EVEN is set at a high level, since the selector S12 (S10, S8, S6, S4, S2, S0) selects the data signal D12 (D10, D8, D6, D4, D2, D0), the data signal DA14 (DA12, DA10, DA8, DA6, DA4, DA2, DA0) supplied from the flip-flop F14 (F12, F10, F8, F6, F4, F2, F0) is set to the logic value d14' (d12', d10', d8', d6', d4', d2', d0'). Further, at the time tg, a rising transition of the selection signal SEL_ODD is occurred.

When a rising transition of the clock signal VCO_CK is occurred, at time th, in a state where the selection signal SEL_ODD is set at a high level, since the selector S13 (S11, S9, S7, S5, S3, S1) selects the data signal D13 (D11, D9, D7, D5, D3, D1), the data signal DA15 (DA13, DA11, DA9, DA7, DA5, DA3, DA1) supplied from the flip-flop F15 (F13, F11, F9, F7, F5, F3, F1) is set to the logic value d15' (d13', d11', d9', d7', d5'; d3', d1'). In addition, when the rising transition of the clock signal VCO_CK is occurred, the selector SX selects the data signal DA0, so that the serial data signal TX_DT is set to the logic value d0'. Further, at the time th, a falling transition of the selection signal SEL_EVEN is occurred. Thereafter, the same operation as that at the time td is performed every time a falling transition of the clock signal VCO_CK is occurred, and the same operation as that at the time te is performed every time a rising transition of the clock signal VCO_CK is occurred, to thereby sequentially set the serial data signal TX_DT to the logic values d1' to d15'.

Figure 5:
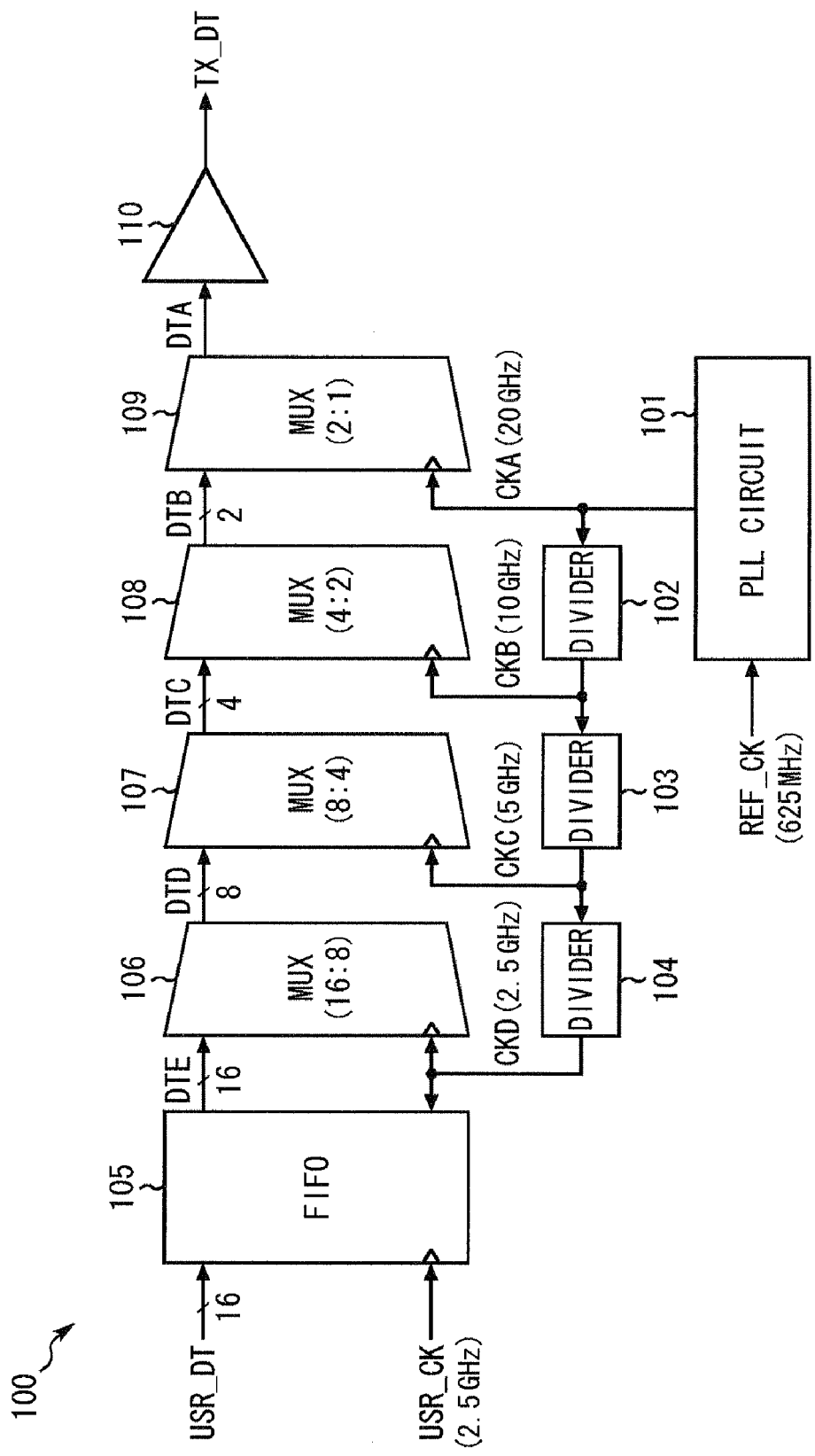
FIG. 5 is an explanatory diagram illustrating an example of a data transmission circuit in a related art.
Figure 6:
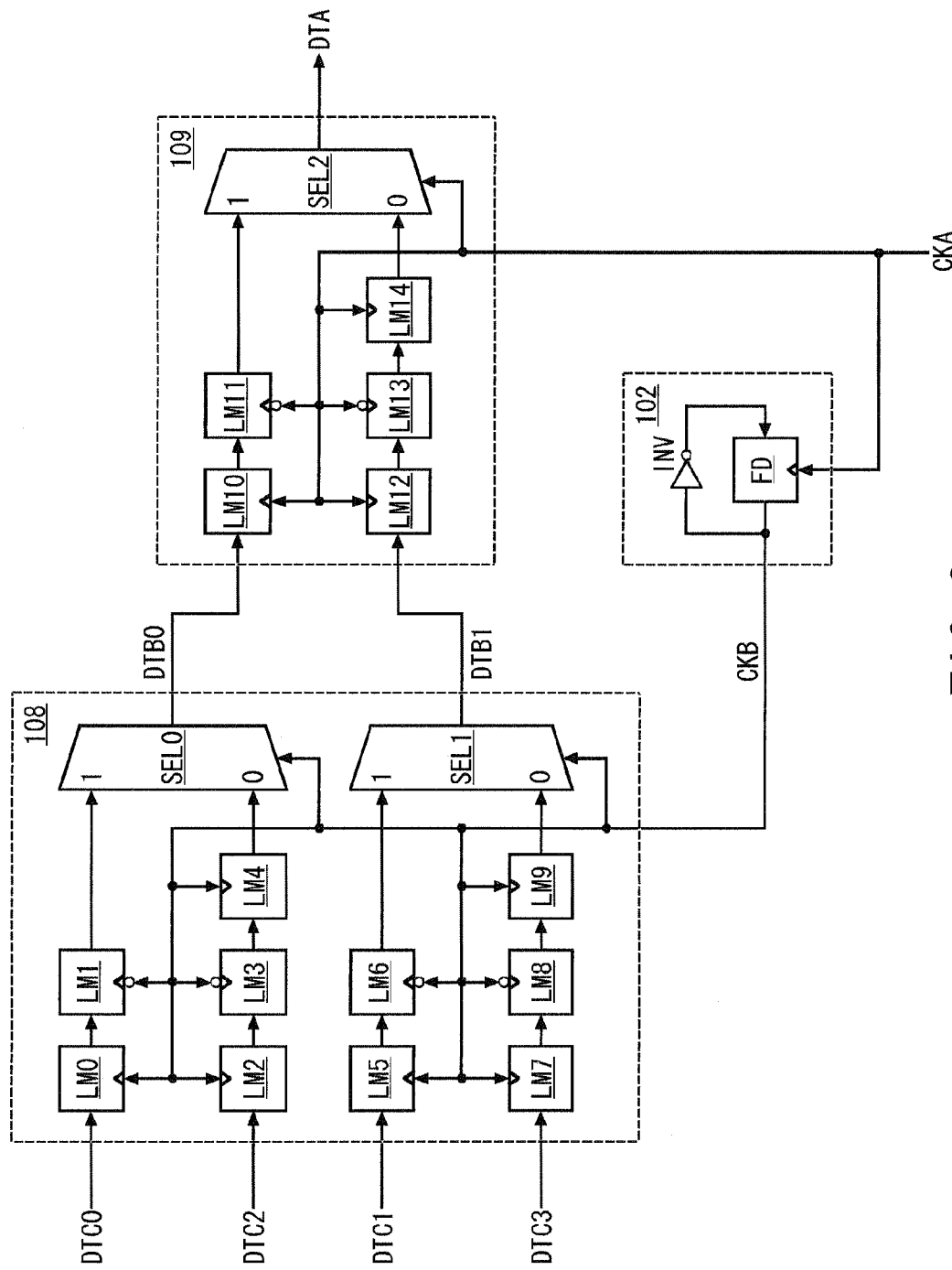
FIG. 6 is an explanatory diagram illustrating a part of the data transmission circuit of FIG. 5.
Figure 7:
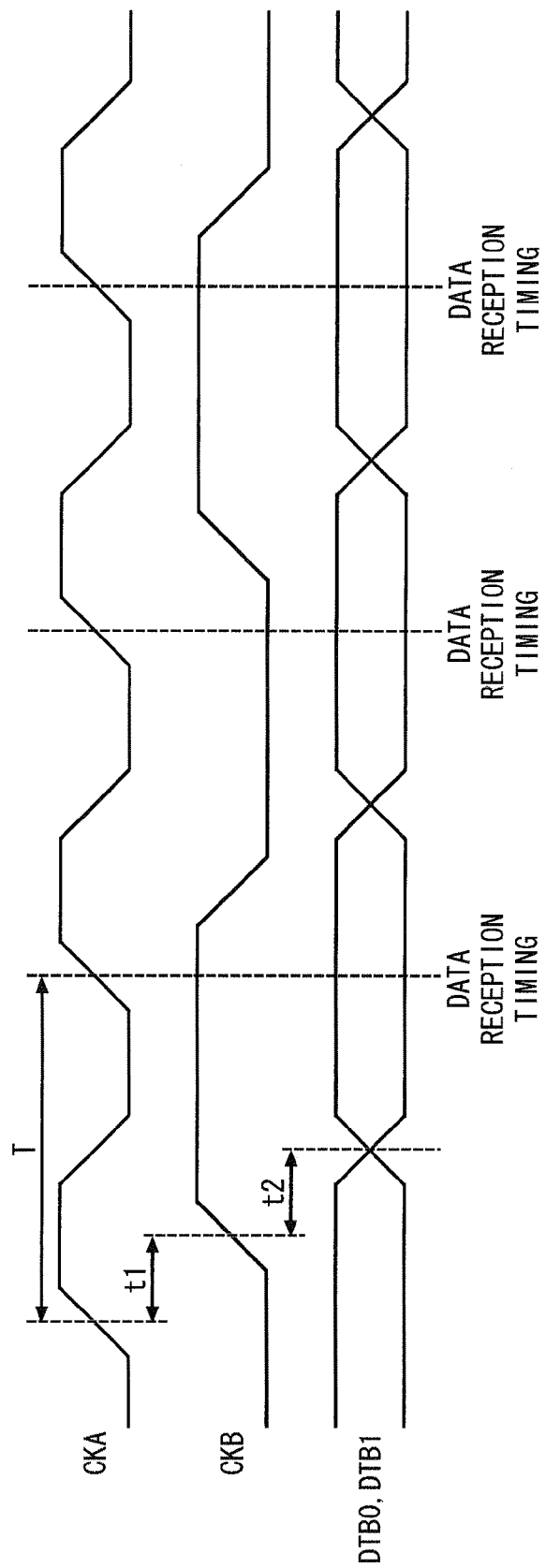
FIG. 7 is an explanatory diagram (No. 1) illustrating a state of data communication between multiplexers in FIG. 6.
Figure 8:
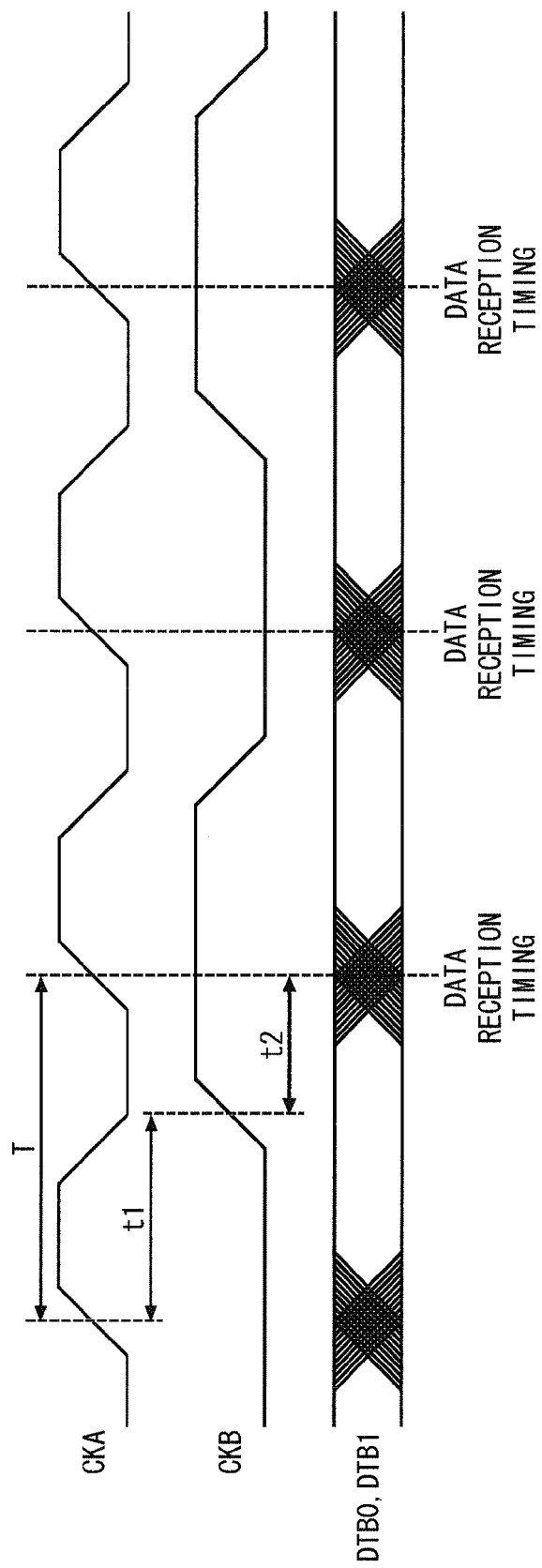
FIG. 8 is an explanatory diagram (No. 2) illustrating a state of data communication between the multiplexers in FIG. 6.

In the one embodiment such as described above, the conversion from the parallel data signals USR_DT into the serial data signal TX_DT is not conducted in stages with the use of a configuration in which dividers and multiplexers are used, but conducted at one stroke with the use of a configuration in which the voltage controlled oscillator OSC and the shift register circuit formed of the flip-flops F0 to F15 and the selectors S0 to S13 and SX are used. Since there is no delay time caused by the dividers that affects a phase relationship of the clock signal and the data signal relevant to the data communication among internal elements, it is possible to conduct the data communication among the internal elements with a sufficiently large timing margin. Accordingly, it is possible to securely conduct the data communication among the internal elements in the data transmission circuit 10 regardless of the improvement in data transfer rate, the Increase in manufacturing variance, the variation in power supply voltage and temperature, and the like. Therefore, it Is possible to configure a data transmission circuit with higher possibility of realization and higher data transfer rate compared to that in the related art (FIG. 5).

Further, the clock transmission path in the voltage controlled oscillator OSC, the data transmission path through the flip-flops F14, F12, F10, F8, F6, F4, F2, and F0, the data transmission path through the flip-flops F15, F13, F11, F9, F7, F5, F3, and F1, and the data transmission path through the flip-flops FT7 to FT0 are laid out for the signal transmissions to run in parallel among these transmission paths, and therefore the data communication among the internal elements can be carried out with a more increased timing margin. Accordingly, it becomes possible to further increase the data transfer rate in the data transmission circuit 10.

Aforementioned embodiment may be applied to a data transmission circuit and a data communication system applied for performing data communication among elements or circuit blocks inside an LSI (Large Scale Integration), data communication among LSIs, data communication among boards or packages, and the like.

In accordance with the progress of a microfabrication of semiconductor process, an influence of a manufacturing variance becomes significant, so that a circuit technology according to the embodiment in which even the influence of the manufacturing variance is taken into consideration becomes an important element technology in the future in realizing an LSI.

According to the embodiments, for example, the data transmission circuit may includes a loop circuit. The loop circuit is configured by annularly coupling a plurality of registers and sequentially transfers a timing signal in synchronization with the clock signal from the clock generation circuit among the plurality of registers. For example, the timing signal in the loop circuit is generated in response to an operation start request to the data transmission circuit. The shift register circuit acquires the parallel data signals in accordance with a transfer of the timing signal from one of the plurality of registers in the loop circuit. Further, a transmission path of the clock signal in the voltage controlled oscillator, a transmission path of the parallel data signals in the shift register circuit, and a transmission path of the timing signal in the loop circuit are laid out for signal transmissions to run in parallel among the transmission path of the clock signal, the transmission path of the parallel data signals, and the transmission path of the timing signal.

According to the embodiments, for example, in the data transmission circuit configured as above, the conversion from the parallel data signals into the serial data signal is not conducted in stages with the use of a configuration in which dividers and multiplexers are used, but conducted at one stroke with the use of a configuration in which the clock generation circuit (voltage controlled oscillator) and the shift register circuit are used. Since there is no delay time caused by the dividers that affects a phase relationship of the clock signal and the data signal relevant to the data communication among the internal elements, it is possible to conduct the data communication among the internal elements with a sufficiently large timing margin. Accordingly, it is possible to securely conduct the data communication among the internal elements in the data transmission circuit regardless of the improvement in data transfer rate, the increase in manufacturing variance, the variation in power supply voltage and temperature, and the like.

According to the embodiment, it is possible to securely conduct data communication among internal elements in a data transmission circuit regardless of the improvement in data transfer rate, the increase in manufacturing variance, the variation in power supply voltage and temperature, and the like. In other words, it is possible to realize a data transmission circuit which is not affected by the improvement in data transfer rate, the increase in manufacturing variance, the variation in power supply voltage and temperature, and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority. Although the embodiments of the present invention have been described in detail, it should be understood that the various changes, substitutions, and alterations could be made hereto without departing from the spirit and scope.

What is claimed is:

1. A data transmission circuit converting parallel data signals Into a serial data signal to transmit the serial data signal, comprising:
   a clock generation circuit generating a clock signal;
   an output circuit provided to output the serial data signal;
   a shift register circuit acquiring the parallel data signals and sequentially transferring the acquired parallel data signals to the output circuit in a bitwise manner with the use of a shift operation synchronized with the clock signal from the clock generation circuit; and
   a voltage controlled oscillator serving as the clock generation circuit and configured by annularly distributing inductance components and capacitance components.

2. The data transmission circuit according to claim 1, further comprising a loop circuit configured by annularly coupling a plurality of registers and sequentially transferring a timing signal in synchronization with the clock signal from the clock generation circuit among the plurality of registers, wherein the shift register circuit acquires the parallel data signals In accordance with a transfer of the timing signal from one of the plurality of registers in the loop circuit.

3. The data transmission circuit according to claim 2, wherein the timing signal in the loop circuit is generated in response to an operation start request to the data transmission circuit.

4. The data transmission circuit according to claim 2, wherein a transmission path of the clock signal in the voltage controlled oscillator, a transmission path of the parallel data signals in the shift register circuit, and a transmission path of the timing signal in the loop circuit are laid out for signal transmissions to run in parallel among the transmission path of the clock signal, the transmission path of the parallel data signals, and the transmission path of the timing signal.

5. A data communication system, comprising a data transmission circuit converting parallel data signals into a serial data signal to transmit the serial data signal, comprising:
   a clock generation circuit generating a clock signal;
   an output circuit provided to output the serial data signal;
   a shift register circuit acquiring the parallel data signals and sequentially transferring the acquired parallel data signals to the output circuit in a bitwise manner with the use of a shift operation synchronized with the clock signal from the clock generation circuit; and
   a voltage controlled oscillator serving as the clock generation circuit and configured by annularly distributing inductance components and capacitance components.

6. The data communication system according to claim 5, wherein the data transmission circuit, further comprising a loop circuit configured by annularly coupling a plurality of registers and sequentially transferring a timing signal in synchronization with the clock signal from the clock generation circuit among the plurality of registers, wherein the shift register circuit acquires the parallel data signals in accordance with a transfer of the timing signal from one of the plurality of registers in the loop circuit.

7. The data communication system according to claim 6, wherein the timing signal in the loop circuit is generated in response to an operation start request to the data transmission circuit.

8. The data communication system according to claim 6, wherein a transmission path of the clock signal in the voltage controlled oscillator, a transmission path of the parallel data signals in the shift register circuit, and a transmission path of the timing signal in the loop circuit are laid out for signal transmissions to run in parallel among the transmission path of the clock signal, the transmission path of the parallel data signals, and the transmission path of the timing signal.

* * * * *